US006775187B1

United States Patent
Hamilton et al.

(10) Patent No.: US 6,775,187 B1
(45) Date of Patent: Aug. 10, 2004

(54) METHOD OF PROGRAMMING A DUAL CELL MEMORY DEVICE

(75) Inventors: Darlene G. Hamilton, San Jose, CA (US); Edward F. Runnion, Santa Clara, CA (US); Edward Hsia, Saratoga, CA (US); Kulachet Tanpairoj, Palo Alto, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/422,489

(22) Filed: Apr. 24, 2003

(51) Int. Cl.[7] .............................................. G11C 16/04
(52) U.S. Cl. ............................. 365/185.28; 365/185.24
(58) Field of Search ...................... 365/185.28, 185.24, 365/185.14, 185.19

(56) References Cited

U.S. PATENT DOCUMENTS

| 6,215,702 B1 | 4/2001 | Derhacobian et al. |
| 6,246,611 B1 | 6/2001 | Pawletko et al. |
| 6,295,228 B1 | 9/2001 | Pawletko et al. |
| 6,307,784 B1 | 10/2001 | Hamilton et al. |
| 6,309,926 B1 | 10/2001 | Bell et al. |
| 6,331,951 B1 | 12/2001 | Bautista, Jr. et al. |
| 6,344,994 B1 | 2/2002 | Hamilton et al. |
| 6,356,482 B1 | 3/2002 | Derhacobian et al. |
| 6,359,807 B1 * | 3/2002 | Ogura et al. ........... 365/185.18 |
| 6,370,061 B1 | 4/2002 | Yachareni et al. |
| 6,400,624 B1 | 6/2002 | Parker et al. |
| 6,442,074 B1 | 8/2002 | Hamilton et al. |
| 6,456,533 B1 | 9/2002 | Hamilton et al. |
| 6,493,269 B1 * | 12/2002 | Cernea ................... 365/185.28 |
| 6,574,139 B2 * | 6/2003 | Kurihara ................ 365/185.03 |

OTHER PUBLICATIONS

*Intel StrataFlash Memory Technology*, Intel Corporation, AP–677, Application Note, Dec. 1998, Order No. 297859–002.

* cited by examiner

*Primary Examiner*—Anh Phung
(74) *Attorney, Agent, or Firm*—Renner, Otto, Boisselle, & Sklar, LLP (57) ABSTRACT

A method of programming a dual cell memory device having a first charge storing cell and second charge storing cell. The first charge storing cell can be pre-read to determine if the first charge storing cell stores an amount of charge to increase a threshold voltage of the memory device over a specified threshold voltage. If not, the second charge storing cell can be programmed with a standard program pulse. If so, the second charge storing cell can be programed with a modified program pulse.

19 Claims, 3 Drawing Sheets

METHOD OF PROGRAMMING A DUAL CELL MEMORY DEVICE

TECHNICAL FIELD

The present invention relates generally to the field of non-volatile memory devices and, more particularly, to a method of storing data using a flash memory device, such as a dual cell, charge trapping dielectric, electrically erasable and programmable memory device.

BACKGROUND

A pervasive trend in modern integrated circuit manufacture is to increase the amount of data stored per unit area on an integrated circuit memory unit, such as a flash memory unit. Memory units often include a relatively large number of core memory devices (sometimes referred to as core memory cells). For instance, a conventional dual cell memory device, such as a charge trapping dielectric flash memory device, can store data in a "double-bit" arrangement. That is, one bit (i.e., a binary data value have two states, such as a logical one and a logical zero) can be stored using a charge storing cell on a first "side" of the memory device and a second bit can be stored using a complimentary charge storing cell on a second "side" of the memory device.

Programming of such a memory device can be accomplished, for example, by hot electron injection. Hot electron injection involves "pulsing" the device by applying appropriate voltage potentials to each of a gate and a drain of the memory device for a specified duration. During the programming pulse, the source is typically grounded. Conventionally, the programming pulse voltage potentials are the same for the first programmed and the second programmed of the charge storing cells.

Reading of the memory device can be accomplished by applying an appropriate voltage to each of the gate and the drain and comparing the drain to source current (as an indication of device threshold voltage) against a reference value to determine if the read charge trapping cell is in a programmed or an unprogrammed state.

Even though conventional charge trapping dielectric flash memory devices are capable of storing charge corresponding to a programmed level in each of the charge storing cells, conventional programming techniques can lead to storing different amounts of charge in the respective charge storing cells and/or different charge profiles (i.e., placement or distribution of charge within the charge trapping layer) along a channel of the device in the respective charge storing cells. For example, programming one of the charge storing cells when the other charge storing cell is blank can result in a charge profile within the programmed charge storing cell that is relatively narrow. However, programming one of the charge storing cells when the other charge storing cell is charged can result in a charge profile within the programmed charge storing cell that is relatively wide.

As the width of the charge profile increases, the trapped electrons are spread over a larger lateral distance within the charge trapping layer. In addition, as the width of the charge profile increases, the more difficult it may become to mask, or cover-up, the charge during a read operation of the opposite charge storing cell by the application of a drain voltage during the read operation. In addition, as the width of the charge profile increases, the more difficult it may become to erase the charge trapping cell using, for example, a hot hole injection band-to-band (BTB) erase technique.

As a result, there is an ever increasing demand to improve the way with which charge is stored in memory devices.

SUMMARY OF THE INVENTION

According to one aspect of the invention, the invention is directed to a method of programming a charge trapping dielectric memory device having a first charge storing cell and a second charge storing cell. The method can includes pre-reading the first charge storing cell to determine if the first charge storing cell stores an amount of charge which increases a threshold voltage of the memory device over a specified threshold voltage; and programming the second charge storing cell to store an amount of charge corresponding to a charged program level by pulsing the memory device with a standard program pulse if the pre-reading indicates that the threshold voltage is less than the specified threshold voltage; otherwise programming the second charge storing cell to store an amount of charge corresponding to the charged program level by pulsing the memory device with a program pulse modified from the standard program pulse.

BRIEF DESCRIPTION OF DRAWINGS

These and further features of the present invention will be apparent with reference to the following description and drawings, wherein.

DISCLOSURE OF INVENTION

In the detailed description that follows, like components have been given the same reference numerals, regardless of whether they are shown in different embodiments of the present invention. To illustrate the present invention in a clear and concise manner, the drawings may not necessarily be to scale and certain features may be shown in somewhat schematic form.

Figure 1:
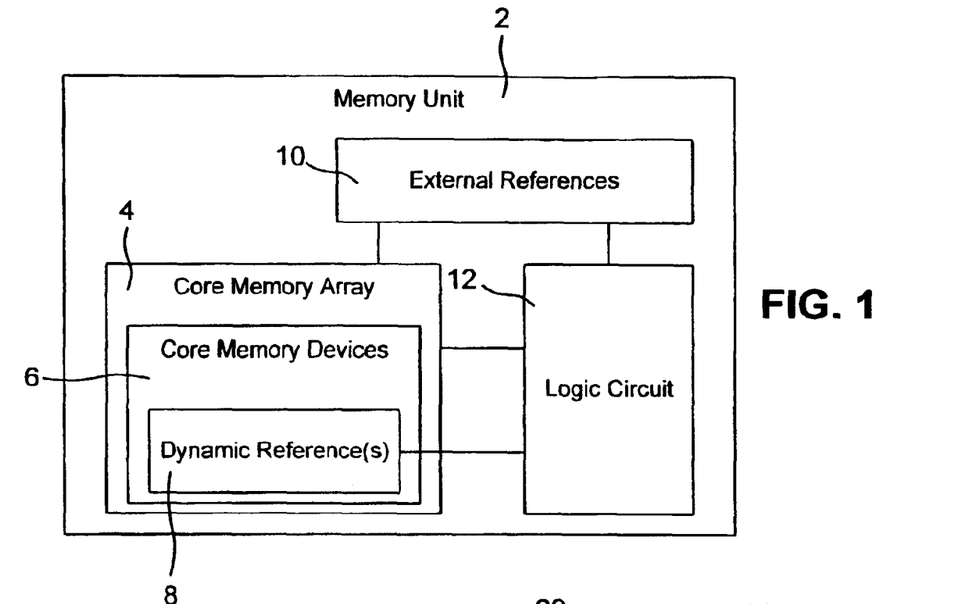
FIG. 1 is a schematic block diagram of an exemplary memory unit having a plurality of core memory devices to which a method of programming in accordance with the present invention can be applied.

With reference to FIG. 1, shown is a schematic block diagram of an exemplary memory unit 2. The memory unit 2 can include a core memory array 4 containing a plurality of memory devices, such as dual cell, non-volatile, flash electrically erasable and programmable memory devices. For example, the memory devices can be charge trapping dielectric flash memory devices as will be discussed in greater detail below.

The memory devices of the core memory array 4 can include a plurality of core memory devices 6 and associated dynamic reference memory devices 8. In one embodiment, the array 4 can be arranged such that the dynamic reference memory devices 8 are formed within a matrix of the core memory devices 6.

Other memory devices, such as external references 10, can also form a part of the memory unit 2. The external reference 10 are separate from the core memory array 4 and can include, for example, erase verify reference cells, program verify reference cells and soft programming reference cells.

As one skilled in the art will appreciate, the core memory devices 6 can be used by a customer of the memory unit 2 to store information, such as data or executable code. The dynamic references 8 can be used to assist in reading the core memory devices 6. More specifically, the dynamic references 8 are used as indicators of the data level behavior of the core memory devices 6. Various operations of the memory unit 2, including, for example, programming, verifying, reading and erasing, can be controlled by a logic circuit 12.

Figure 2:
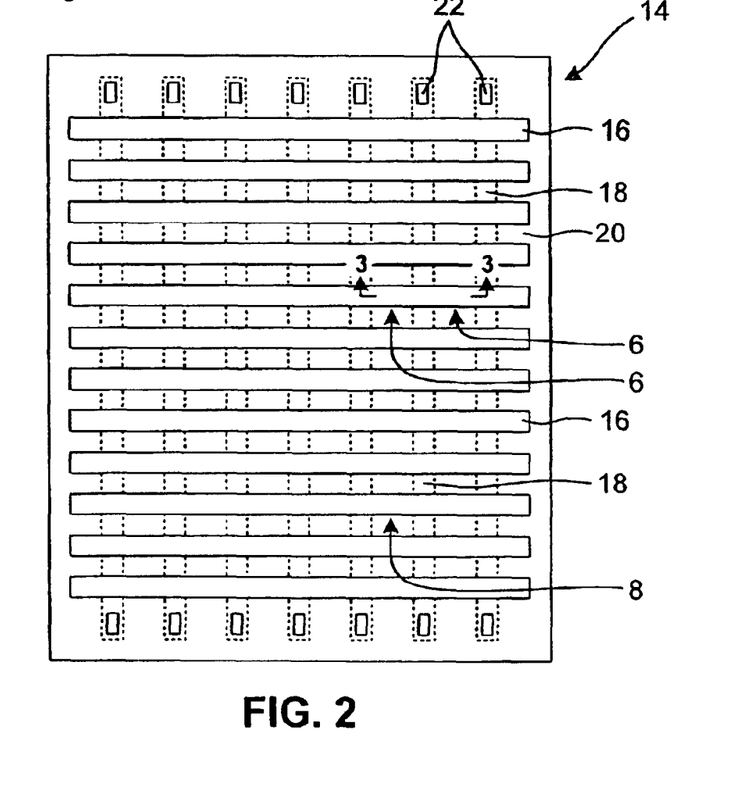
FIG. 2 is a schematic block diagram of a portion of a core memory array from the memory unit that can include the core memory devices.

With additional reference to FIG. 2, shown is a top view, schematic block diagram of a portion, or sector 14, of the core memory array 4 from the memory unit 2. The sector 14 can include core memory devices 6 and one or more dynamic reference devices 8. The sector 14 can include word lines 16 and bit lines 18 arranged with a dielectric stack 20 to operatively form the core memory devices 6 and the dynamic reference device(s) 8. Application of appropriate voltages to the word lines 16 and the bit lines 18 allows for the addressing of the memory devices 6, 8 of the sector 14 such that each memory device can be programmed, read, verified and/or erased. Bit line contacts 22 can be used to establish electrical connection to the bit lines 18 through the dielectric stack 20.

Figure 3:
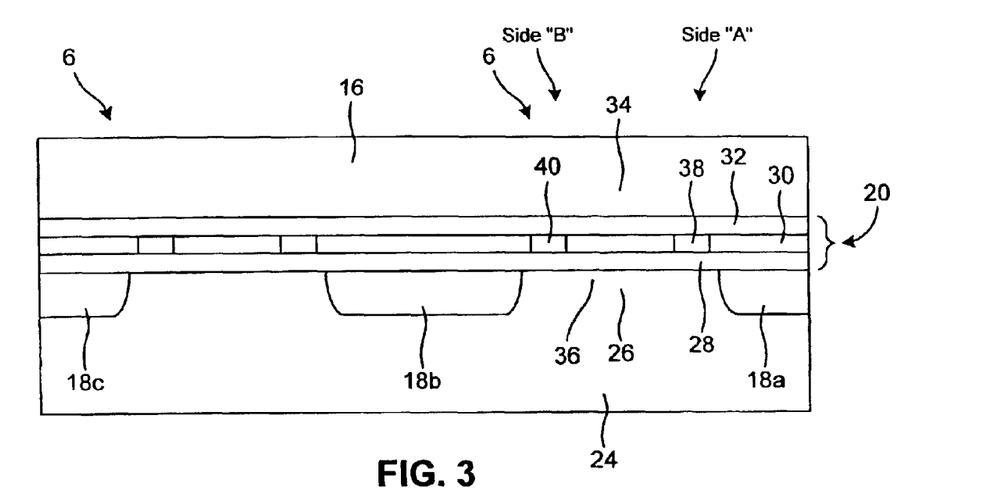
FIG. 3 is a schematic cross-section illustration of exemplary core memory devices from the core memory array taken along the line 3—3 of FIG. 2.

With additional reference to FIG. 3, a portion of the sector 14 is illustrated in cross-section to illustrate an exemplary arrangement of the memory devices of the core memory array 4. The cross-section of FIG. 3 shows two core memory devices 6. Each of the core memory devices 6, as well as the dynamic reference memory devices 8, can be implemented as a virtual ground, dual cell, non-volatile, flash electrically erasable and programmable memory devices. It should be understood that the illustrated memory devices 6 are shown for exemplary purposes and can be implemented with alternative structures (e.g., in stacked gate arrangement, in recessed gate arrangement, etc.). In addition, the relative positioning of the core memory devices 6 with respect to the dynamic reference 8 can be modified.

The exemplary memory devices 6 are implemented as a charge trapping dielectric type flash memory devices, each of which includes a pair of complimentary charge trapping regions 38, 40 that can be independently programmed and read.

For simplicity of the discussion herein, only the arrangement of one core memory device 6 will be described. However, the remaining core memory devices 6 and the dynamic reference memory devices 8 can have a corresponding structure and operation.

In the illustrated embodiment, the core memory device 6 includes a P-type semiconductor substrate 24. Within the substrate 24, the bit lines 18 are formed in a buried bit line format. The bit lines 18 (also referred to herein as conductive regions) can be formed by implanting N-type dopant into the substrate 24, or from a metal or metal containing compound (e.g., silicide bit lines 18). For each device 6, adjacent pair of bit lines 18 form conductive regions that function as a source and a drain during various programming and reading operations. For each device, a body 26 is disposed between the adjacent pairs of bit lines 18. Although not illustrated, a nitride layer can be formed over the bit lines 18 and P+ pocket implants can be added adjacent the bit lines 18.

Above the substrate 24 is the dielectric stack 20. The dielectric stack 20 includes a bottom dielectric layer 28 (also referred to as a tunneling dielectric layer) that is made from, for example, silicon oxide ($SiO_2$), other standard-K material (e.g., have a relative permittivity below ten) or a high-K material (e.g., have a relative permittivity, in one embodiment, above ten and, in one embodiment, above twenty).

Over the bottom dielectric layer 28 is a charge trapping layer (also referred to as a charge storing layer 30). The charge storing layer 30 can be made from, for example, a non-conductive material including silicon nitride ($Si_3N_4$) or other suitable material.

Over the charge storing layer 30 is another dielectric layer (also referred to as a top dielectric layer 32) made from a material such as, for example, silicon oxide, other standard-K material or a high-K material.

The word lines 16 are formed over the top dielectric layer 32. For each core memory device 6, one of the word lines 16 functions as a gate electrode 34. The word lines 16 can be formed from, for example, polycrystalline silicon. In alternative arrangements, the gate electrodes 34 can be formed from interconnected conductive islands or pads. A work function of the word line 16 and the dielectric stack 20 controls a channel 36 within the body 26, extending from one bit line 18 to an adjacent bit line 18.

As one skilled in the art will appreciate, modifications to the core memory devices 6 can be made. Such modifications can include changes to the physical arrangement of the core memory device 6, materials used, doping parameters and the like. However, the programming, verifying, reading and/or erasing techniques described herein can be used in conjunction with such a modified device.

The core memory devices 6 can be configured as virtual ground devices. That is, during various operations of the memory devices 6 either of the bit lines 18 associated with the memory device 6 can function as a source of electrons or holes by respectively controlling the voltage potentials applied to the corresponding bit lines 18. In addition, the bit line 18 that functions as the source of electrons and/or holes can be grounded or can be connected to a bias potential.

As will become more apparent from the discussion below, within the charge storing layer 30, the core memory device 6 includes a first charge storing region (also referred to herein as a normal cell, a right-hand bit or a first charge storing cell 38) adjacent one of the conductive regions (e.g., the bit line identified as bit line 18a) and a second charge storing region (also referred to herein as a complimentary cell, a left-hand bit or a second charge storing cell 40) adjacent the other of the conductive regions (e.g., the bit line identified as bit line 18b).

In the illustrated embodiment, the core memory device 6 is a structurally symmetrical device allowing for programming, verifying, reading and erasing of the first charge storing cell 38 and the second charge storing cell 40 by respectively switching the roles of the bit lines 18a and 18b (source and drain) during those operations. Therefore, the bit lines 18a, 18b will be referred to interchangeably by the terms source and drain, depending on the charge storing cell 38, 40 of interest.

In one embodiment, referred to herein as a "single-bit" embodiment, each charge storing cell 38, 40 can have two data states. However, each charge storing cell 38, 40 is programmed to stored the same data state to enhance data retention. To determine the data state stored by each charge storing cell 38, 40, only one of the charge storing cells 38, 40 needs to be read.

In another embodiment, referred to herein as a "dual-bit" embodiment, each charge storing cell 38, 40 can independently have two data states. That is, each charge storing cell 38, 40 can be programmed to either of the data states to take advantage of the asymmetrical date storage capability of the core memory device 6. To determine the data state stored by each charge storing cell 38, 40, each of the charge storing cells 38, 40 can be read in separate read operations.

In the single-bit embodiment and the dual-bit embodiment, the data states can represent binary values such as a logical zero and a logical one. The logical one, for example, can be implemented by leaving the desired charge storing cell 38, 40 in an unprogrammed state, also referred to as a blank program level. The logical zero, for example, can be implemented by storing an amount of charge in the desired charge storing cell 38, 40. This condition is also referred to as a charged state, a programmed state, a programmed level or a charged program level.

In another embodiment, referred to herein as a "single-bit multi-level cell (MLC)" embodiment or "single-bit MLC" embodiment, each charge storing cell 38, 40 can have multiple data states, such as four data states. However, each charge storing cell 38, 40 is programmed to stored the same data state to enhance data retention. To determine the data state stored by each charge storing cell 38, 40, only one of the charge storing cells 38, 40 needs to be read. Therefore, in the single-bit MLC embodiment, each core memory device 6 (or "transistor") has four data states (i.e., the four data states associated with the read charge storing cell 38, 40). In another embodiment there can be more than three charged program levels.

In another embodiment, referred to herein as a "quad-bit" embodiment, each charge storing cell 38, 40 can independently have multiple data states, such as four data states. That is, each charge storing cell 38, 40 can be programmed to any of the multiple data states to take advantage of the asymmetrical date storage capability of the core memory device 6. To determine the data state stored by each charge storing cell 38, 40, each of the charge storing cells 38, 40 can be read in separate read operations. Therefore, in the quad-bit embodiment, each core memory device 6 (or "transistor") has sixteen data states (i.e., between the associated pair of charge storing cells 38, 40, there are sixteen permutations of the blank program level and the three charged program levels). In another embodiment there can be more than three charged program levels.

In the single-bit MLC embodiment and the quad-bit embodiment, the data states of the individual charge storing cells 38, 40 can represent a two bit binary word, such as a logical zero-zero, logical zero-one, logical one-zero and logical one-one. The logical one-one data state, for example, can be implemented by leaving the desired charge storing cell 38, 40 in an unprogrammed state, also referred to as a blank program level which will be referred to herein as "level A". The other logical data states, for example, can be implemented by storing distinguishable amounts of charge in the desired charge storing cell 38, 40, which are also referred to as a charged states, programmed states, programmed levels or charged program levels. A lowest charged program level corresponding to the one-zero data state will be referred to herein as "level B". A medium charged program level corresponding to the zero-one data state will be referred to herein as "level C". A highest charged program level corresponding to the zero-zero data state will be referred to herein as "level D". In another implementation of the single-bit MLC embodiment and the quad-bit embodiment, there can be more than three charged program levels.

For purposes of the present disclosure, the programming technique to store charge with either of the charge storing cells 38, 40 involves hot electron injection, also referred to as channel hot electron injection (CHE). However, it should be appreciated that modifications to the programming techniques can be made to accommodate variations in the specific memory device used.

Using hot electron injection, the first charge storing cell 38 can be programmed to the desired charged program level (in the single-bit and dual-bit embodiments, the single charged program level or in the single bit MLC and quad-bit embodiments, any of the multiple charged program levels) by applying a selected voltage to the bit line 18a (functioning as the drain) adjacent the first charge storing cell 38. In addition, a selected voltage is applied to the word line 16 (functioning as the gate electrode 34). The other bit line 18b functions as the source (i.e., source of electrons) for the CHE programming of the first charge storing cell 38. In one embodiment, a bias voltage potential is applied to the source (rather than grounding or floating the source as found in conventional charge trapping dielectric flash memory devices). As a result of the application of a bias potential to the source during programming, greater control over electron injection can be accomplished, which can lead to enhanced data retention capability of the memory device 6 and/or greater charge injection accuracy for achieving the desired charged program level.

The voltages applied to the gate electrode 34, the source and the drain generate a vertical electric field through the dielectric layers 28, 32 and the charge storing layer 30 and a lateral electric field along the length of the channel 36 from the source to the drain. At a given threshold voltage, the channel 36 will invert such that electrons are drawn off the source and begin accelerating toward the drain. As the electrons move along the length of the channel 36, the electrons gain energy and upon attaining enough energy, the electrons are able to jump over the potential barrier of the bottom dielectric layer 28 and into the charge storing layer 30 where the electrons become trapped. The probability of electrons jumping the potential barrier is a maximum in the area of the charge storing cell 38 adjacent the drain (i.e., bit line 18a), where the electrons have gained the most energy. These accelerated electrons are termed hot electrons and once injected into the charge storing layer 30, stay in the charge storing cell 38 of the charge storing layer 30. The trapped electrons tend not to spread through the charge storing layer 30 due to this layer's low conductivity and low lateral electric field therein. Thus, the trapped charge remains localized in the charge trapping region of the charge storing cell 38 close to the adjacent bit line 18a.

The foregoing technique to program the first charge storing cell 38 can be used to program the second charge storing cell 40, but the functions of the bit lines 18a and 18b (i.e., source and drain) are reversed.

Figure 4:
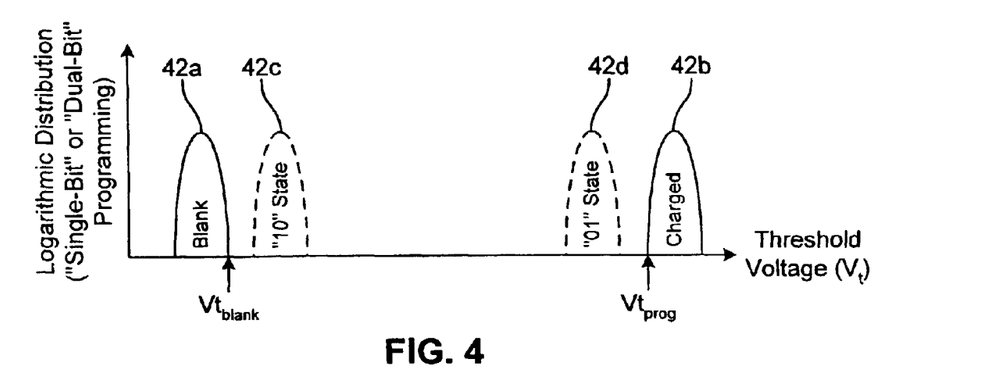
FIG. 4 is a population plot that includes relative program level threshold voltage distributions for "single-bit" and "dual-bit" programming of a charge storing cell from the core memory device.

With additional reference to FIG. 4, shown is a population plot that includes relative program level threshold voltage (Vt) distributions 42 for single-bit and dual-bit programming of a charge storing cell 38, 40 from the core memory device 6. The threshold voltage distributions 42 are indicative of the data state behavior of the core memory device 6 when the charge storing cells 38, 40 are placed in various respective data states.

A first distribution 42a represents a logarithmic threshold voltage distribution for the memory device 6 when both charge storing cells 38, 40 store respective charge amounts corresponding to the blank program level. That is, when one of the charge storage cells 38, 40 is read and both charge storing cells 38, 40 are in the blank state, the threshold voltage of the memory device 6 should fall within the first distribution 42a. Using the corresponding binary data values for this data storage condition, the first distribution 42a can be referred to as a "11" state, where the first "1" of the "11" corresponds to charge storing cell 38, 40 being read (or "read bit") and the second "1" of the "11" corresponds to the other of the charge storing cells 38, 40 (or "unread bit"). A maximum value of the first distribution 42a represents an erase or blank threshold voltage ($Vt_{blank}$) of the core memory device 6.

A second distribution 42b represents a logarithmic threshold voltage distribution for the core memory device 6 when both charge storing cells 38, 40 store respective charge amounts corresponding to the charged program level. That is, when one of the charge storage cells 38, 40 is read and both charge storing cells 38, 40 are in the charged state, the threshold voltage of the memory device 6 should fall within the second distribution 42b. Using the corresponding binary data value for this data storage condition, the second distribution 42b can be referred to as a "00" state, where the first "0" of the "00" corresponds to the read bit and the second "0" of the "00" corresponds to the unread bit.

A third distribution 42c represents a logarithmic threshold voltage distribution for the core memory device 6 when the read one of the charge storing cells 38, 40 stores a charge amount corresponding to the blank program level and the unread one of the charge storing cells 38, 40 stores a charge amount corresponding to the charged program level. Using the corresponding binary data value for this data storage condition and the first and second digit naming convention identified above, the third distribution 42c can be referred to as a "10" state. The "10" state can also be referred to as a complimentary bit disturb (CBD) state since the charge stored by the unread bit has the effect of slightly increasing the threshold voltage of the memory device 6 above the blank state distribution 42a.

A fourth distribution 42d represents a logarithmic threshold voltage distribution for the core memory device if the read one of the charge storing cells 38, 40 stores a charge amount corresponding to the charged program level and the unread one of the charge storing cells 38,40 stores a charge amount corresponding to the blank program level. Using the corresponding binary data value for this data storage condition and the first and second digit naming convention identified above, the third distribution 42b can be referred to as a "01" state. In this situation, the differing charge amounts stored by the charge storing cells 38, 40 has the effect of slightly decreasing the threshold voltage of the memory device 6 below the programmed state distribution 42b.

Figure 5:
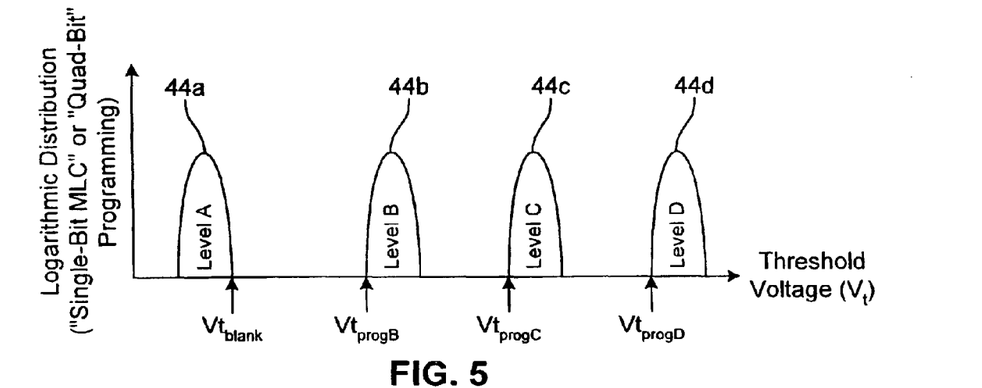
FIG. 5 is a population plot that includes relative program level threshold voltage distributions for "single-bit multi-level cell (MLC)" and "quad-bit" programming of a charge storing cell from the core memory device.

With additional reference to FIG. 5, shown is a population plot that includes relative threshold voltage (Vt) distributions 44 for single-bit MLC and quad-bit programming of a charge storing cells 38, 40 from the core memory device 6. The blank state, or level A, is represented by distribution 44a, level B is represented by distribution 44b, level C is represented by distribution 44c and level D is represented by distribution 44d. Relative threshold voltage distributions for the data states of the other of the charge storing cells 38, 40 of the core memory device 6 would have similar appearance to those illustrated in FIG. 5. For simplicity of the drawing figures attached hereto, CBD threshold voltage distributions similar to the CBD threshold distributions 42c and 42d (FIG. 4) illustrated for the single bit and dual bit embodiments are not illustrated in FIG. 5. However, when the charge storing cells 38, 40 are programmed to dissimilar data states, the threshold voltage distributions 44 can have a tendency to shift upward or downward along the threshold voltage axis as a result of CBD.

A combination of program conditions (discussed below in greater detail) can be selected such that when the target charge storing cell 38, 40 is programmed to level D, the amount of charged stored by the cell 38, 40 is higher than the amount of charge stored by the cell 38, 40 when the cell 38, 40 is programmed to level C. In one embodiment, a minimum threshold voltage ($Vt_{progD}$) of the level D distribution 44d is about one volt higher than a maximum threshold voltage of the level C distribution 44c. Similarly, the amount of charged stored by the cell 38, 40 programmed to level C is higher than the amount of charge stored by the cell 38, 40 when the cell 38, 40 is programmed to level B. In one embodiment, a minimum threshold voltage ($Vt_{progC}$) of the level C distribution 44c is about one volt higher than a maximum threshold voltage of the level B distribution 44b. Similarly, the amount of charged stored by the cell 38, 40 programmed to level B is higher than the amount of charge stored by the cell 38, 40 when the cell 38, 40 is programmed to level A. In one embodiment, a minimum threshold voltage ($Vt_{progB}$) of the level B distribution 44b is about 1.5 volts higher than a maximum threshold voltage of the level A distribution 44a, or the erase threshold voltage ($Vt_{blank}$).

It is noted that the threshold voltage distribution 42a for the blank state of the single-bit and dual-bit embodiments can correspond to the threshold voltage distribution 44a for the blank state of the single-bit MLC and quad-bit embodiments (e.g., the minimum, maximum and peak distribution points can be the same or approximately the same). Similarly, the threshold voltage distribution 42b for the charged program state of the single-bit and dual-bit embodiments can correspond to the threshold voltage distribution 44d for the highest charge program state of the single-bit MLC and quad-bit embodiments (e.g., the minimum, maximum and peak distribution points can be the same or approximately the same).

Reading of the cells 38, 40 of the core memory device 6 can be carried out using, for example, a reverse read operation. For example, to read the first charge storing cell 38, a voltage can be applied to the conductive region opposite the first charge storing region 38 (i.e., bit line 18b, which is also referred to as the drain during read operations) and a voltage can be applied to the gate electrode 34. The conductive region adjacent the first charge storing region 38 (i.e., bit line 18a, which is also referred to as the source during read operations) can be grounded. To read the second charge storing cell 40, the roles of the bit lines 18a and 18b can be reversed.

During the read operation, an amount of current drawn across the channel 36 can be used as an indication of core memory device 6 threshold voltage and can be compared against a reference current(s) (the reference current acting as an indication of a reference threshold voltage) to determine the data state of the "read" one of the charge storing cells 38, 40.

The read operation drain voltage functions to create a depletion region in the channel 36 under the unread charge storing cell 38, 40. This depletion region can partially mask, or "cover up," any charge stored by the unread charge storing cell 38, 40 to minimize the effect of CBD on read margin. For the dual-bit and quad-bit embodiments, the drain voltage can be about 1.3 V to about 1.6 V and the gate voltage can be about five volts. For the single-bit and single-bit MLC embodiments, the drain voltage can be less than one volt (e.g., about 0.4 volts to about 0.7 volts) and the gate voltage can be about three volts.

As previously indicated, charge stored by a first programmed charge storing cell 38, 40 can impact the programming of a second programmed charge storing cell 38, 40. For instance, the previously stored charge may have a tendency to lower the programming current (current from drain to source or $I_{ds}$). In effect, the gate to source voltage ($V_{gs}$) and the drain to source voltage ($V_{ds}$) appear to be higher than if the charge storing cell 38, 40 opposite the programmed (or target) charge storing cell 38, 40 were in the blank state. As a result, the program operation can be faster than if the charge storing cell 38, 40 opposite the target charge storing cell 38, 40 were in the blank state. When programming speed is increased, the region in which charge is injected into the charge trapping layer 30 (FIG. 3) adjacent the drain can become wider.

Figure 6:
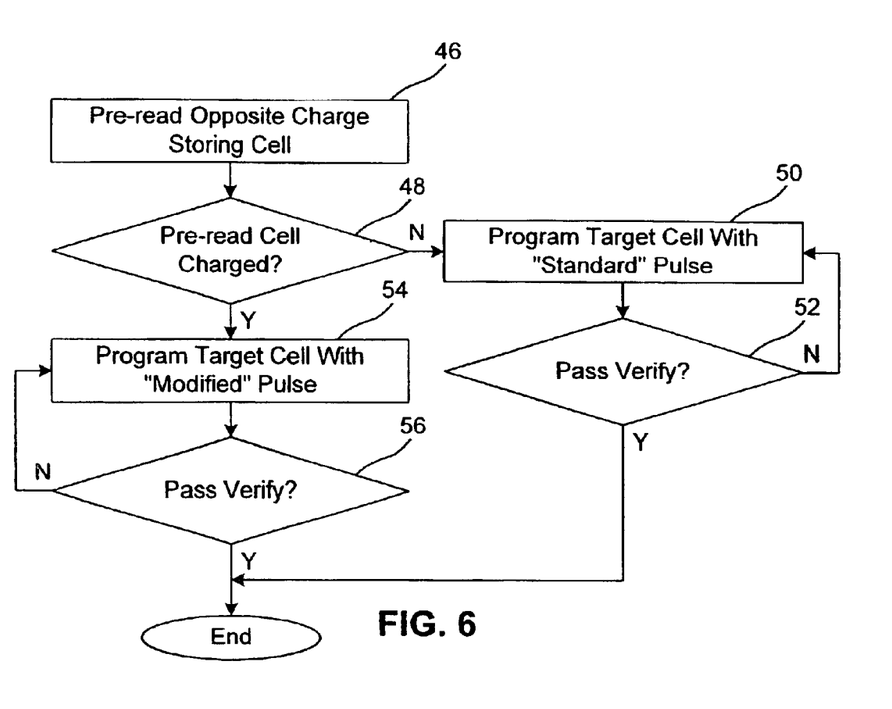
FIG. 6 is a flow diagram of a method of programming the dual cell memory device in accordance with the invention.

With addition reference to FIG. 6, shown is a method of programming one of the charge storing cells 38, 40 of a memory device 6 where the method includes operations to compensate for charge stored by the other of the charge storing cells 38, 40 of the memory device 6. Programming the memory cell 6 in accordance with the concepts of the method described herein can lead to narrower regions in which charge is injected into the charge trapping layer 30 adjacent the drain. As a result, read operations can be carried out with greater accuracy and erase operations can be carried out with greater reliability.

It is noted that prior to programming of the charge storing cells 38, 40, the core memory array 4, or a portion thereof, can be erased to configure the core memory array 4. The erase configuration places each charge storing cell 38, 40 in a blank program state.

The exemplary method illustrated in FIG. 6 can be repeated for each charge storing cell 38, 40 of the core memory array 4 (or a subset of the charge storing cells 38, 40 of the core memory array 4), including the cells 38, 40 of the core memory devices 6 and the dynamic references 8. However, if the data pattern being stored indicates that a particular charge storing cell 38, 40 should be left blank, the method can be skipped for that charge storing cell 38, 40 and programming of a subsequent charge storing cell 38, 40 can be carried out. Accordingly, blank charge storing cells 38, 40 can be "programmed" by leaving the charge storing cell 38, 40 the blank state established by the erase configuration.

The method can start in block 46 where the charge storing cell 38, 40 opposite the charge storing cell 38, 40 to be programmed is read. For example, if the first charge storing cell 38 is targeted for programming, then the second charge storing cell 40 can be read in block 46. Similarly, if the second charge storing cell 40 is targeted for programming, then the first charge storing cell can be read in block 46.

If, in block 48, the charge storing cell 38, 40 that was read in block 46 (i.e., the pre-read charge storing cell 38, 40) is in a blank state, then the method can proceed to block 50. In block 50, charge storing cell 38, 40 targeted for programming (also referred to as the target charge storing cell 38, 40) can be pulsed by the application of a "standard" program pulse. A standard program pulse can include the application of voltage potentials to the gate electrode 34, the drain and/or the source for a specified duration, each of which are selected for the desired charged program level (e.g., the charged program level in the single-bit and dual-bit embodiments, or level B, level C or level D in the single-bit MLC and quad-bit embodiments) and for when the opposite charge storing cell 38, 40 is blank.

Thereafter, in block 52, the target charge storing cell 38, 40 can be verified to ensure that sufficient charge was injected to increase the threshold voltage of the device to correspond to the desired charged program level. For example, the threshold voltage of the device 6 (as indicated by the amount of current drawn across the channel from drain to source (e.g., $I_{ds}$)) can be compared against a program-verify reference value (e.g., threshold voltage or current) appropriate for the desired charged program level. The program-verify reference value can be generated by an external reference device 10. In one embodiment, at least three program-verify reference currents are generated, each corresponding to the various minimum charged program level threshold voltages $Vt_{progB}$, $Vt_{progC}$ and $Vt_{progD}$.

If, in block 52, the target charge storing cell 38, 40 passes the verify operation, the programming of the target charge storing cell 38, 40 can be considered complete. Thereafter, the method can be repeated for another charge storing cell 38, 40 from the same device 6 or another device 6 within the core memory array 4.

However, if in block 52, the target charge storing cell 38, 40 does not pass the verify operation, the target charge storing cell 38, 40 can be re-pulsed. For example, the method could return to block 50 for re-application of the standard program pulse. In an alternative embodiment, the program voltages applied during re-pulsing of the memory device 6 can be modified from the initial standard program voltages used in block 50. For example, the program voltages can be changed based on the number of times the memory device 6 has been pulsed or on the current threshold voltage of the memory device 6.

If, in block 48, the pre-read charge storing cell 38, 40 stores an amount of charge corresponding to a charged program level (e.g., the charged program level in the single-bit and dual-bit embodiments, or level B, level C or level D in the single-bit MLC or quad-bit embodiments), then the method can proceed to block 54. In an alternative embodiment, the threshold voltage of the memory device 6 can be compared against a pre-read threshold voltage where the pre-read threshold voltage is indicative of charge stored by the pre-read charge storing cell 38, 40, but not necessarily a charged program level.

In block 54, the target charge storing cell 38, 40 can be pulsed by the application of a "modified" program pulse. A modified program pulse can include the application of voltage potentials to the gate electrode 34, the drain and/or the source for a specified duration, each of which are selected for the desired charged program level (e.g., the charged program level in the single-bit and dual-bit embodiments, or level B, level C or level D in the single-bit MLC and quad-bit embodiments) and for when the opposite charge storing cell 38, 40 is charged.

In one embodiment, the modified program pulse includes lower gate voltages than the standard program pulse. The lower gate voltages can effective slow charge injection by increasing the programming current such that the effect of the charge stored by the opposite charge storing cell 38, 40 can be minimized. As a result, the width of the injected charge profile can be controlled. In addition to or instead or lowering the gate voltage, the modified program pulse can include lowering the drain voltage and/or increasing the source voltage. In yet another alternative, the pulse width can be modified.

Thereafter, in block 56, the target charge storing cell 38, 40 can be verified to ensure that sufficient charge was injected to increase the threshold voltage of the device to correspond to the desired charged program level. For example, similar to the verify operation of block 52, the threshold voltage of the device 6 (as indicated by the amount of current drawn across the channel from drain to source (e.g., $I_{ds}$)) can be compared against a program-verify reference value (e.g., threshold voltage or current) appropriate for the desired charged program level.

If in block 56, the target charge storing cell 38, 40 passes the verify operation, the programming of the target charge storing cell 38, 40 can be considered complete. Thereafter, the method can be repeated for another charge storing cell 38, 40 from the same device 6 or another device 6 within the core memory array 4.

However, if in block 56, the target charge storing cell 38, 40 does not pass the verify operation, the target charge storing cell 38, 40 can be re-pulsed. For example, the method could return to block 54 for re-application of the modified program pulse. In an alternative embodiment, the program voltages applied during re-pulsing of the memory device 6 can be modified from the initial modified program voltages used in block 54. For example, the program voltages can be changed based on the number of times the memory device 6 has been pulsed or on the current threshold voltage of the memory device 6.

Although particular embodiments of the invention have been described in detail, it is understood that the invention is not limited correspondingly in scope, but includes all changes, modifications and equivalents coming within the spirit and terms of the claims appended hereto. For instance, certain steps of the method illustrated in FIG. 6 can be omitted, certain steps can be carried out concurrently and/or additional steps can be added.

What is claimed is:

1. A method of programming a charge trapping dielectric memory device having a first charge storing cell and a second charge storing cell, comprising:

pre-reading the first charge storing cell to determine if the first charge storing cell stores an amount of charge which increases a threshold voltage of the memory device over a specified threshold voltage; and programming the second charge storing cell to store an amount of charge corresponding to a charged program level by pulsing the memory device with a standard program pulse if the pre-reading indicates that the threshold voltage is less than the specified threshold voltage; otherwise programming the second charge storing cell to store an amount of charge corresponding to the charged program level by pulsing the memory device with a program pulse modified from the standard program pulse.

2. The method according to claim 1, further comprising programming the first charge storing cell to the charged program level.

3. The method according to claim 2, wherein the charged program level is selected from a plurality of charged program levels.

4. The method according to claim 2, further comprising reading the second programmed charge storing cell to determine a data value stored by the memory device.

5. The method according to claim 1, wherein the charged program level is selected from a plurality of charged program levels.

6. The method according to claim 5, further comprising programming the first charge storing cell to another of the charged program levels from the plurality of charged program levels.

7. The method according to claim 1, wherein the charge storing cells are regions of a charge storing layer that is operatively arranged with a first conductive region adjacent the first charge storing cell, a second conductive region adjacent the second charge storing cell and a gate electrode.

8. The method according to claim 1, further comprising verifying that the second charge storing cell stores charge corresponding to the charged program level.

9. The method according to claim 7, wherein if the verification fails, the method further comprises re-pulsing the second charge storing cell.

10. The method according to claim 1, wherein the charge storing cells are regions of a charge storing layer that is operatively arranged with a first conductive region adjacent the first charge storing cell, a second conductive region adjacent the second charge storing cell and a gate electrode and storing the amount of charge includes applying a source bias voltage potential to the conductive region adjacent the second charge storing cell.

11. The method according to claim 1, wherein the modified program pulse includes a lower gate voltage than the standard program pulse.

12. The method according to claim 11, wherein the modified program pulse includes a lower drain voltage than the standard program pulse.

13. The method according to claim 12, wherein the modified program pulse includes a higher source voltage than the standard program pulse.

14. The method according to claim 11, wherein the modified program pulse includes a higher source voltage than the standard program pulse.

15. The method according to claim 1, wherein the modified program pulse includes a lower drain voltage than the standard program pulse.

16. The method according to claim 15, wherein the modified program pulse includes a higher source voltage than the standard program pulse.

17. The method according to claim 1, wherein the modified program pulse includes a higher source voltage than the standard program pulse.

18. The method according to claim 1, wherein modifications to the standard program pulse are made based on an amount of charge stored by the first charge storing cell.

19. The method according to claim 1, wherein modifications to the standard program pulse are made based on a program level stored by the first charge storing cell.

* * * * *

UNITED STATES PATENT AND TRADEMARK OFFICE
CERTIFICATE OF CORRECTION

PATENT NO.    : 6,775,187 B1
DATED         : August 10, 2004
INVENTOR(S)   : Hamilton et al.

It is certified that error appears in the above-identified patent and that said Letters Patent is hereby corrected as shown below:

Title page,
Item [57], ABSTRACT,
Line 2, replace "cell and second charge" with -- cell and a second charge --
Line 8, replace "programed" with -- programmed --

Signed and Sealed this

Fourteenth Day of December, 2004

JON W. DUDAS
*Director of the United States Patent and Trademark Office*